(12) United States Patent  (10) Patent No.: US 7,624,791 B2
Strobel et al.  (45) Date of Patent: Dec. 1, 2009

(54) COOLING APPARATUS FOR ELECTRONICS

(75) Inventors: Kurt Richard Strobel, Fort Collins, CO (US); Igor G. Morozov, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 137 days.

(21) Appl. No.: 11/530,348

(22) Filed: Sep. 8, 2006

(65) Prior Publication Data

US 2008/0060791 A1  Mar. 13, 2008

(51) Int. Cl.
F28F 3/12 (2006.01)
(52) U.S. Cl. .................... 165/168; 165/80.5
(58) Field of Classification Search ............ 165/80.4, 165/80.5, 168, 178, DIG. 538; 361/699, 361/702
See application file for complete search history.

(56) References Cited

U.S. PATENT DOCUMENTS

| | | | |
|---|---|---|---|
| 5,159,529 A | 10/1992 | Lovgren | |
| 5,499,450 A | 3/1996 | Jacoby | |
| 5,526,231 A | 6/1996 | Arz | |
| 5,826,645 A | 10/1998 | Meyer | |
| 5,829,516 A | 11/1998 | Lavochkin | |
| 5,960,861 A | 10/1999 | Price | |
| 6,031,751 A | 2/2000 | Janko | |
| 6,111,749 A | 8/2000 | Lamb et al. | |
| 6,125,035 A | 9/2000 | Hood | |
| 6,189,213 B1 | 2/2001 | Kimura | |
| 6,226,178 B1 | 5/2001 | Broder | |
| 6,536,516 B2 * | 3/2003 | Davies et al. | 165/170 |
| 6,580,609 B2 | 6/2003 | Pautsch | |
| 6,591,898 B1 | 7/2003 | Chu et al. | |
| 6,661,658 B2 | 12/2003 | Capriz | |
| 6,665,184 B2 | 12/2003 | Akselband | |
| 6,711,017 B2 | 3/2004 | Kurokawa | |
| 6,802,366 B1 | 10/2004 | Dillon | |
| 6,853,555 B2 | 2/2005 | Fichera | |
| 6,918,437 B2 | 7/2005 | Eytcheson | |
| 6,989,991 B2 | 1/2006 | Barson | |
| 2003/0128508 A1 * | 7/2003 | Faneuf et al. | 361/687 |
| 2005/0115701 A1 * | 6/2005 | Martin et al. | 165/170 |
| 2005/0189098 A1 * | 9/2005 | Wisniewski et al. | 165/178 |
| 2006/0096738 A1 * | 5/2006 | Kang et al. | 165/80.4 |

* cited by examiner

Primary Examiner—Teresa J Walberg
(74) Attorney, Agent, or Firm—Neugeboren O'Dowd PC; Sean R. O'Dowd

(57) ABSTRACT

In one embodiment, an apparatus includes a monolithically formed thermal conducting body that includes a passageway that extends from a first end to a second end of the body. At least one of the first end or the second end of the body is configured to couple the body to a tubular member. The body also defines a substantially non-circular outer perimeter, and at least a portion of the passageway of the body defines a substantially circular cross-section. The passageway of the body is configured to receive fluid there through, and the body has a substantially planar outer surface that is configured to be placed in contact with a heat generating component. In some embodiments, the body can be coupled to a plate. In some embodiments, an apparatus can include more than one such thermal conducting body.

24 Claims, 12 Drawing Sheets

COOLING APPARATUS FOR ELECTRONICS

FIELD OF THE INVENTION

The invention relates to cooling systems, and in particular, but not by way of limitation, the invention relates to an apparatus for cooling an electronic component.

BACKGROUND OF THE INVENTION

Known cooling systems, such as coldplates, are used to cool components of an electronic device or system. Some coldplates include a copper plate with drilled passages through which water or other fluid is circulated. Such coldplates provide very low thermal resistance, but the copper plates are typically large and very heavy making them expensive to manufacture and difficult to machine. Other known coldplates include an aluminum plate with copper tubing. This type of coldplate is lighter and less expensive to manufacture, but has the disadvantage of a higher thermal resistance.

Some known cooling devices include the use of flattened, large diameter copper tubing that can be used alone or in conjunction with an aluminum plate. The flattened tube offers low thermal resistance over its surface. The disadvantage of this type of cooling device is that the flattened tubing has a small passageway that can be easily clogged and create a high differential pressure of the fluid flowing through the tubing. This type of device is also difficult to manufacture. For example, it can be difficult to machine threaded holes in the tubing for screw connections to, for example, a source of fluid or between tubing portions. The tubing typically includes complex solder or braze joints to form a water seal. In addition, it may not be possible to add other features to the tubing, such as bosses, ridges, and countersinks.

In addition, large coldplates are commonly used in generators, for example, to drive plasma processes. Such coldplates typically have multiple water passages and span an entire width of the generator. Because such high power dissipation components present in such generators are constrained by two planar surfaces, there is often unused or underutilized coldplate surface area.

Accordingly, there is a need for a cooling apparatus that is relatively light weight, easy to manufacture, and provides flexibility for efficient and effective cooling of electronic components.

Although present devices are functional, they are not sufficiently accurate or otherwise satisfactory. Accordingly, a system and method are needed to address the shortfalls of present technology and to provide other new and innovative features.

SUMMARY OF THE INVENTION

Exemplary embodiments of the invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

In some embodiments, the invention may be characterized as an apparatus that includes a monolithically formed thermal conducting body having a passageway that extends from a first end to a second end of the body. At least one of the first end or the second end of the body is configured to couple the body to a tubular member. The body also defines a substantially non-circular outer perimeter, and at least a portion of the passageway of the body defines a substantially circular cross-section. The passageway of the body is configured to receive fluid there through, and the body has a substantially planar outer surface that is configured to be placed in contact with a heat generating component.

In another embodiment, the invention may be characterized as an apparatus, that includes a plate and an elongate body that is coupled to a surface of the plate. The elongate body includes a first end and a second end and defines a passageway configured to receive a fluid there through. A tubular member is also coupled to the plate and an end of the tubular member is coupled to the first end of the elongate body such that a passageway of the tubular member is in communication with the passageway of the elongate body. The elongate body includes a surface configured to be placed in contact with an electronic component.

In yet another embodiment, the invention may be characterized as an apparatus that includes a first body and a second body. Each of the first body and the second body includes a first end and a second end and defines a passageway configured to receive a fluid there through. The first end of the first body is configured to be coupled to an inlet pipe and the first end of the second body is configured to be coupled to an outlet pipe. A tubular member that defines a passageway has a first end that is coupled to the second end of the first body, and a second end that is coupled to the second end of the second body such that the passageway of the tubular member is in communication with the passageway of the first body and the passageway of the second body.

BRIEF DESCRIPTION OF THE DRAWINGS

Various objects and advantages and a more complete understanding of the invention are apparent and more readily appreciated by reference to the following Detailed Description and to the appended claims when taken in conjunction with the accompanying Drawings.

DETAILED DESCRIPTION

In accordance with one or more embodiments of the invention, a cooling apparatus is provided that is configured to be coupled to a heat generating component, such as a component of an electronic system such as, for example a plasma generator. The cooling apparatus provides a means for cooling the heat generating component during its operation. An apparatus as described herein can include one or more thermal conducting bodies that have a fluid passageway and a surface configured to contact a heat generating component. A thermal conducting body according to some embodiments of the invention can be configured to be used alone, or can be coupled to other components of an apparatus, such as coupled to a plate and/or tubular member. Thus, an apparatus as described herein can include one or more thermal conducting bodies, a thermal conducting body coupled to a tubular member, a thermal conducting body coupled to a plate, or any other combination or sub-combination of the components described herein.

An apparatus as described herein can provide flexibility in the cooling of heat generating components, such as components within various electronic devices or systems. For example, a thermal conducting body as described herein can be sized and configured such that the thermal conducting body can be positioned where low thermal resistance is needed, and where a typical coldplate may not be configured to fit. In one example, an apparatus can include a copper thermal conducting body coupled to an aluminum plate. Such an apparatus can be relatively light weight and inexpensive to manufacture, while also providing varying levels of thermal resistance. For example, the apparatus can be positioned such that the copper body is placed where a low thermal resistance is needed, and the aluminum plate is positioned where higher thermal resistance is acceptable. A thermal conducting body as described herein also allows for low total differential pressure within the fluid passageway, low risk of clogging, and design flexibility in terms of size and/or shape, all of which will be described in more detail below.

A thermal conducting body (also referred to herein as "body") can be formed by various processes. For example, a body can be machined, extruded or drawn. In some embodiments, a thermal conducting body is monolithically formed. For example, the thermal conducting body is formed entirely with the same material. In some embodiments, a thermal conducting body has a single thermal resistance, while in other embodiments, a thermal conducting body can have varying thermal resistance. For example, a first portion of a body can have a first thermal resistance and a second portion of the body can have a second thermal resistance, different than the first.

Figure 1:
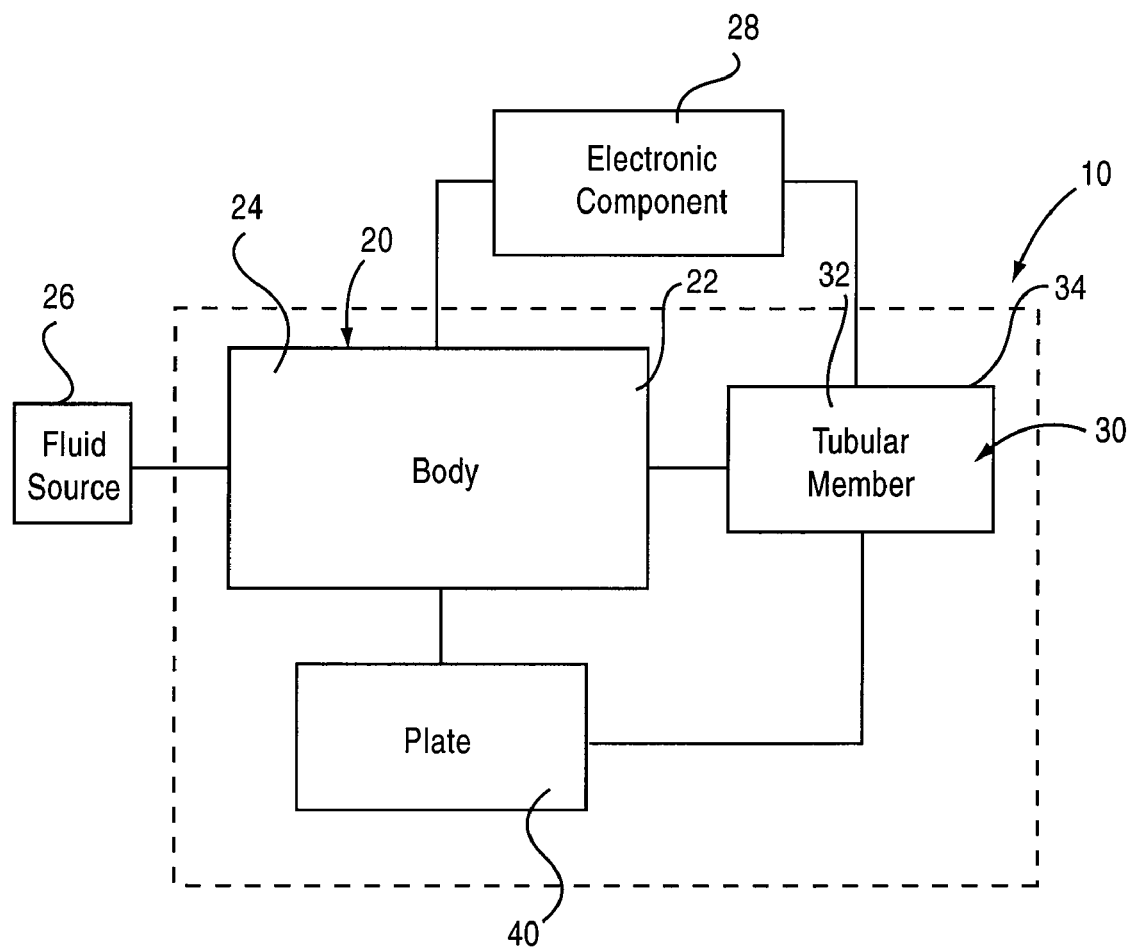
FIG. 1 is a schematic illustration of a cooling apparatus according to an embodiment of the invention.

Referring now to FIG. 1, which is a schematic illustration of an apparatus according to an embodiment of the invention, an apparatus 10 includes a thermal conducting body 20 having a first end 22 and a second end 24. A passageway (not shown in FIG. 1) is defined between the first end 22 and the second end 24 of the thermal conducting body 20. The passageway is configured to receive a fluid (e.g., water, coolant) therethrough. In some embodiments, at least one of the first end 22 or the second end 24 can be configured to couple the body 20 to a tubular member (also referred to herein as "tube"), such as a tubular member 30, and the other end of the body 20 can be configured to couple to an inlet pipe or outlet pipe configured, for example, to deliver fluid from a source of fluid 26 to the body 20. In one example, the first end 22 of the body 20 can include a threaded portion to threadedly couple the body 20 to the tubular member 30, and the second end 24 can include a threaded portion to couple the body 20 to an inlet or outlet pipe of a source of fluid 26. In some embodiments, other coupling methods can be used to couple the elongate body 20 to a tubular member, such as, for example, soldering, adhesively coupling with, for example, an epoxy, or an o-ring fitting. In some embodiments, a sealing member, such as an o-ring, can also be used to provide a sealing coupling between a tubular member and the body 20.

As stated above, the body 20 can be monolithically formed with a variety of different thermally conductive materials. For example, the body 20 can be formed with copper or with a copper alloy material. The body 20 can alternatively be formed with other suitable materials, such as, for example, aluminum or an aluminum alloy, or other material(s) having sufficient thermal resistance properties. In some embodiments, the body 20 is not monolithically formed, but instead includes different portions formed with different materials. The body 20 can be formed by various methods such as, for example, the body 20 can be machined, extruded or drawn.

The body 20 can be a variety of different shapes and sizes. For example, in some embodiments, the body 20 is elongate or has an elongate portion. In some embodiments, the body 20 includes at least a portion that is substantially curved or substantially U-shaped and/or a portion that is substantially rectangular. The body 20 can also have a variety of different outer perimeter shapes, such as circular, rectangular, square, triangular, etc. The passageway of the body 20 can have a cross-section that includes at least a portion that is substantially circular. In some embodiments, the passageway of the body 20 can have at least a portion that is non-circular. For example, at least a portion of the passageway of the body 20 has a substantially square cross-section or a substantially rectangular cross-section. Some embodiments include fins or other extended heat transfer surfaces. Additional features, such as bosses, ridges and/or countersinks can be added for device mounting or structurally securing the body 20 within a system.

In some embodiments, the fluid delivered to and received within the passageway of the body 20 is a liquid (e.g., water, coolant), but a person skilled in the art will appreciate, having the benefit of this disclosure, that the fluid being delivered into the passageway of the body 20 may be any kind of fluid including, for example, a mixture of elements and/or compounds in any phase, such as a gas or a liquid. The body 20 can be configured to receive fluid under various pressure levels, temperatures, and from a variety of different sources.

As shown in FIG. 1, in some embodiments, an apparatus 10 can include one or more tubular members 30. In such an embodiment, the body 20 can be coupled to the tubular member 30 as described above. The tubular member 30, can be for example, a fluid pipe. The tubular member 30 can include a first end 32 and a second end 34, and define a passageway (not shown in FIG. 1) between the first end 32 and the second end 34. The passageway of the tubular member 30 can be in fluid communication with the passageway of the body 20 when the tubular member 30 is coupled to the body 20. The tubular member 30 can have a variety of different shapes and sizes. For example, the tubular member 30 can have a non-circular outer perimeter and/or a circular outer perimeter. The passageway of the tubular member 30 can also have, in some embodiments, a non-circular cross-section or at least a portion with a non-circular cross-section, and/or a circular cross-section or at least a portion with a circular cross-section. The first end 32 and the second end 24 of the tubular member 30 can each include a threaded portion for coupling the tubular member 30 to, for example, a body 20 or other component, such as an inlet or outlet pipe. For example, the tubular member 30 can be coupled on one end to a first body and on an opposite end to a second body. In some embodiments, the tubular member 30 can be substantially linear or include a portion that is substantially linear. In some embodiments, the tubular member 30 can include one or more curved portions.

In some embodiments, an apparatus can also include a plate 40. The body 20 can be coupled to the plate 40 and/or the tubular member 30 can be coupled to the plate 40. The body 20 and/or the tubular member 30 can each be coupled to the plate 40 using a variety of different coupling methods, such as, for example, mechanical fasteners, such as brackets or screws, or with adhesives, such as an epoxy, or with a press fit or friction fit. A thermally conductive compound can be used to seal the coupling between body 20 and the plate 40. In some embodiments, a thermal grease can be disposed between the plate 40 and the body 20. In some embodiments, the body 20 can be coupled to the plate 30 on a surface of the plate 40 such that at least a portion of the body 20 extends from the surface of the plate 40, such as extending below or above the surface of the plate 40. For example, the body 20 can be coupled to the plate 40 such that at least a portion of the body 20 is countersunk from an outer surface of the plate 40, or in some embodiments the body 20 can be mounted such that a surface of the body 20 is flush with an outer surface of the plate 40. Thus, the body 20 can be coupled in a variety of different configurations to one of several different portions, sides or surfaces of the plate 40.

In an embodiment including a tubular member 30, the tubular member 30 can also be coupled to the plate 40 in the same manners as described above for the body 20. In some embodiments, the tubular member 30 is coupled to the same side or surface of the plate 40 as the body 20. In alternative embodiments, the tubular member 30 is coupled to the plate 40 on a different side or surface than the body 20. For example, the body 20 can be coupled on one side or surface of the plate, such as for example, a top surface, and the tubular member 30 can be coupled to an opposite side or surface, such as a bottom surface.

The tubular member 30 can be formed by any known method of forming tubular components, such as methods used for forming tubular fluid pipes. The tubular member 30 can be formed with one or more materials, and with a variety of different materials, such as, for example, copper and/or aluminum, which provide sufficient thermal resistance. Likewise, the plate 40 can be formed with one or more of a variety of different materials, such as, for example, copper or aluminum. Thus, any of the body 20, the tubular member 30 and the plate 40 can be formed with any suitable thermal conducting material. The tubular member can also be flexible, non-conductive tubing or hose.

As stated above, an apparatus can include various combinations of the above described components and the various components can be formed with the same or different materials. For example, in one embodiment, an apparatus includes only a single body formed with copper or a copper alloy. In another embodiment, an apparatus includes one or more bodies formed with copper or a copper alloy, and a tubular member and a plate each formed with aluminum or an aluminum alloy.

In use, an apparatus 10 can be coupled to an electronic component and used to cool the electronic component during its operation. For example, an apparatus 10 can be coupled to an electronic component 28 with a surface of the body 20 contacting the electronic component 28.

Having described above various general principles, several exemplary embodiments of these concepts are now described. These embodiments are only examples, and many other configurations of apparatus 10 and its various components are contemplated by the principles of the invention, and will be apparent to the artisan in view of the general principles described above and the exemplary embodiments.

Figure 2A:
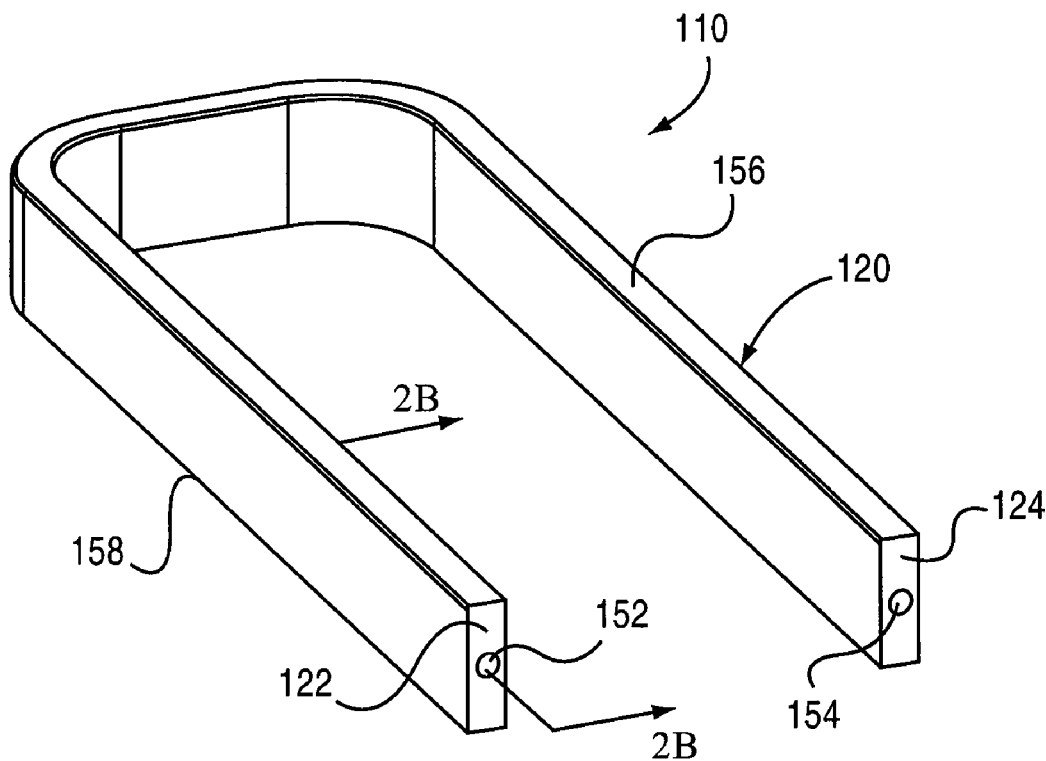
FIG. 2 is perspective view of a cooling apparatus according to an embodiment of the invention.
FIG. 2B is a cross-sectional view of a portion of the cooling apparatus of FIG. 2A taken along line 2B-2B in FIG. 2A.
Figure 2B:
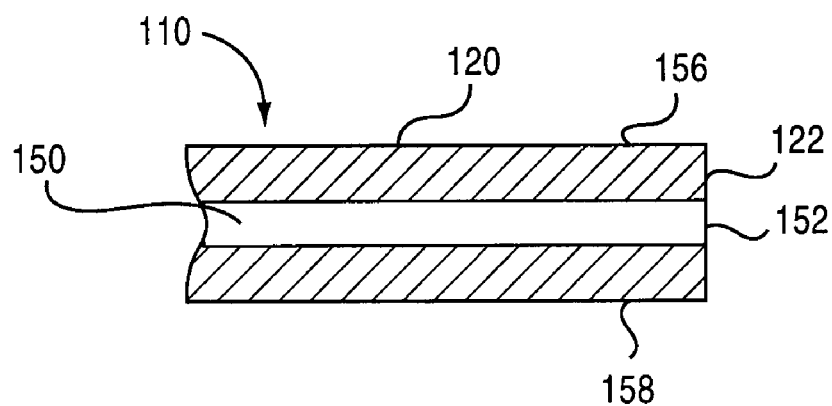

FIGS. 2A and 2B illustrate a cooling apparatus according to an embodiment of the invention. An apparatus 110 includes a body 120 having a substantially U-shaped configuration. The body 120 includes a first end 122, a second end 124 and defines a passageway 150 (shown in FIG. 2B) between the first end 122 and the second end 124. The body 120 can be formed for example, by using a hollow, drawn or extruded raw material, which eliminates the need for cutting, or gun-drilling the fluid passageway 150. The U-shaped configuration of body 120 can then be formed by a bending operation, which allows for the elimination of internal connections and solder joints that are often needed in a machined component. Because of minimum bend radii associated with such raw stock used to form body 120, the resulting differential pressure due to the bends will be small relative to, for example, a gun-drilled plate. In alternative embodiments, a body can be formed with more or less bends than the two bends shown in FIG. 2A.

The first end 122 of body 120 defines an opening 152 in communication with the passageway 150, and the second end 124 defines an opening 154 in communication with the passageway 150. In this embodiment, a cross-section of body 120, as shown on first end 122 and second end 124, is substantially rectangular, and a cross-section of the passageway 150 is substantially circular. The body 120 includes a first substantially planar surface 156 and a second substantially planar surface 158. The body 120 can be coupled to an electronic component such that the electronic component is in contact with at least a portion of either surface 156 or surface 158. An inlet pipe for a source of fluid (not shown in FIGS. 2A and 2B) can be coupled to and in communication with one of the openings 152 or 154 and an outlet pipe (not shown in FIGS. 2A and 2B) can be coupled to and in communication with the other of openings 152 and 154. Fluid can flow through the passageway 150 when the body 120 is coupled to a fluid source.

Figure 3A:
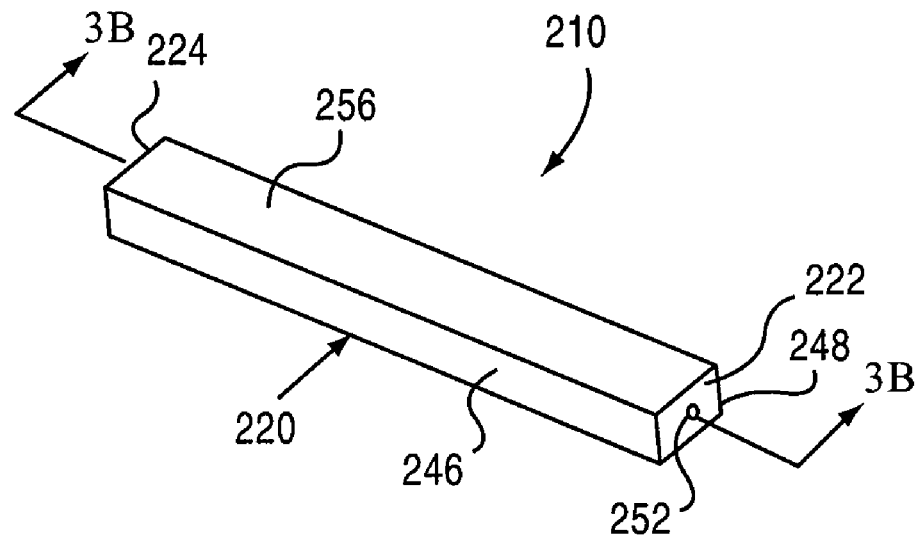
FIG. 3A is a perspective view of a cooling apparatus according to another embodiment of the invention.
Figure 3B:
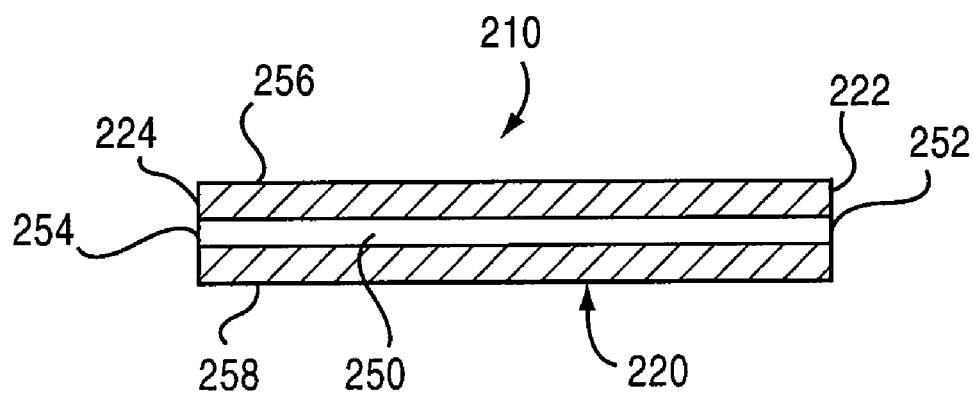
FIG. 3B is a cross-sectional view of the cooling apparatus of FIG. 3A taken along line 3B-3B in FIG. 3A.

FIGS. 3A and 3B illustrate a cooling apparatus according to another embodiment of the invention. An apparatus 210 includes a body 220 that has an elongate and rectangular configuration. As with the embodiment described above, the body 220 can be extruded, drawn or machined, which provides flexibility in terms of varying the size and shape of the body 220. The body 220 includes a first end 222, a second end 224 and defines a passageway 250 between the first end 222 and the second end 224. The first end 224 defines an opening 252 and the second end 224 defines an opening 254, each of which are in communication with the passageway 250. As with the previous embodiment, the body 220 also includes a substantially planar surface 256 and a second substantially planar surface 258, each configured to be placed in contact with an electronic component. In addition, in this embodiment, the body 220 has a third surface 246 and a fourth surface 248. Thus, the body 220 provides four surfaces through which heat transfer can occur. The apparatus 220 can be used in the same manner as the apparatus 120 for cooling electronic components. The body 220 can be sized and dimensioned such that it is small enough to be used in a variety of different locations within an electronic device. For example, the body 220 can in some embodiments, have a width that is less than or equal to 3 inches (7.62 cm), a height that is less than or equal 2 inches (5.08 cm), and a length that is greater than or equal to 6 inches (15.24 cm).

Figure 4:
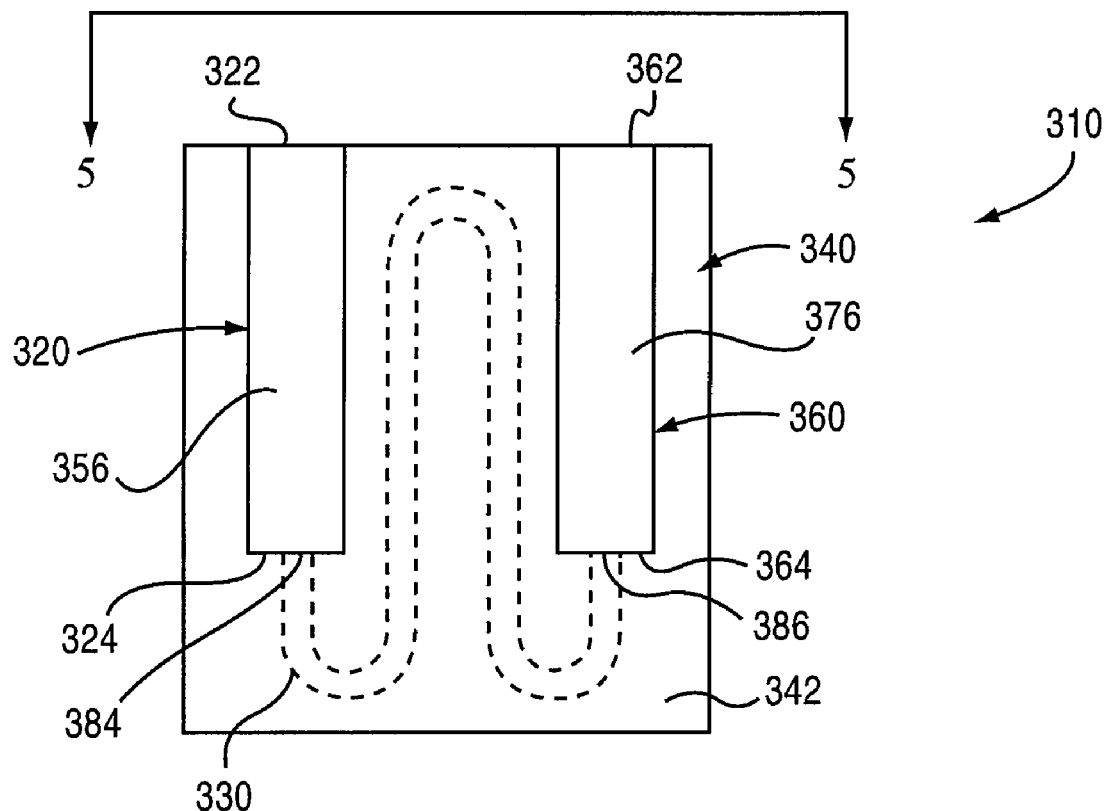
FIG. 4 is a plan view of a cooling apparatus according to an embodiment of the invention.
Figure 5:
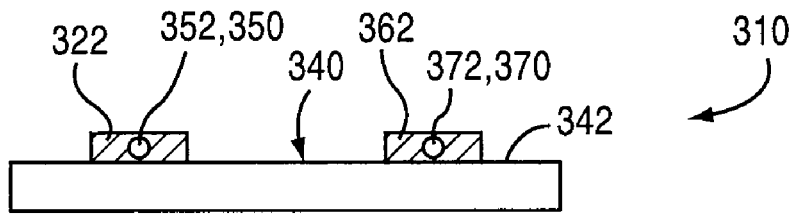
FIG. 5 is a cross-sectional view of the cooling apparatus of FIG. 4 taken along line 5-5 in FIG. 4.
Figure 6:
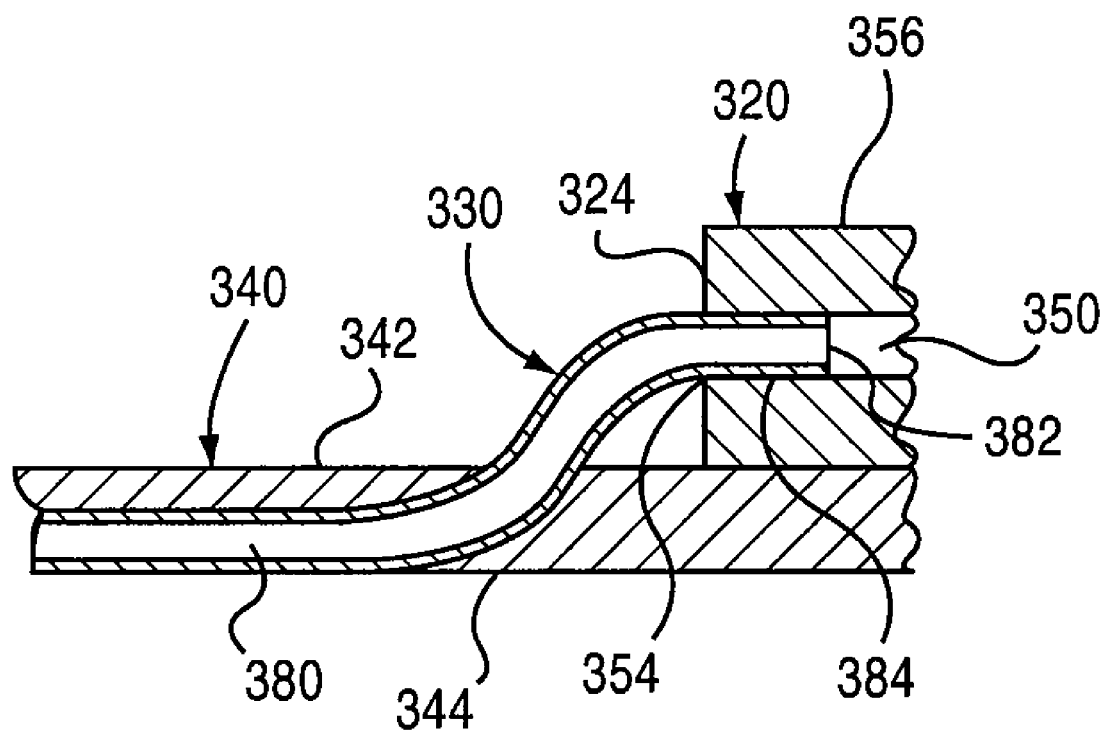
FIG. 6 is a cross-sectional view of a portion of the cooling apparatus of FIG. 4 taken along line 6-6 in FIG. 4.
Figure 7:
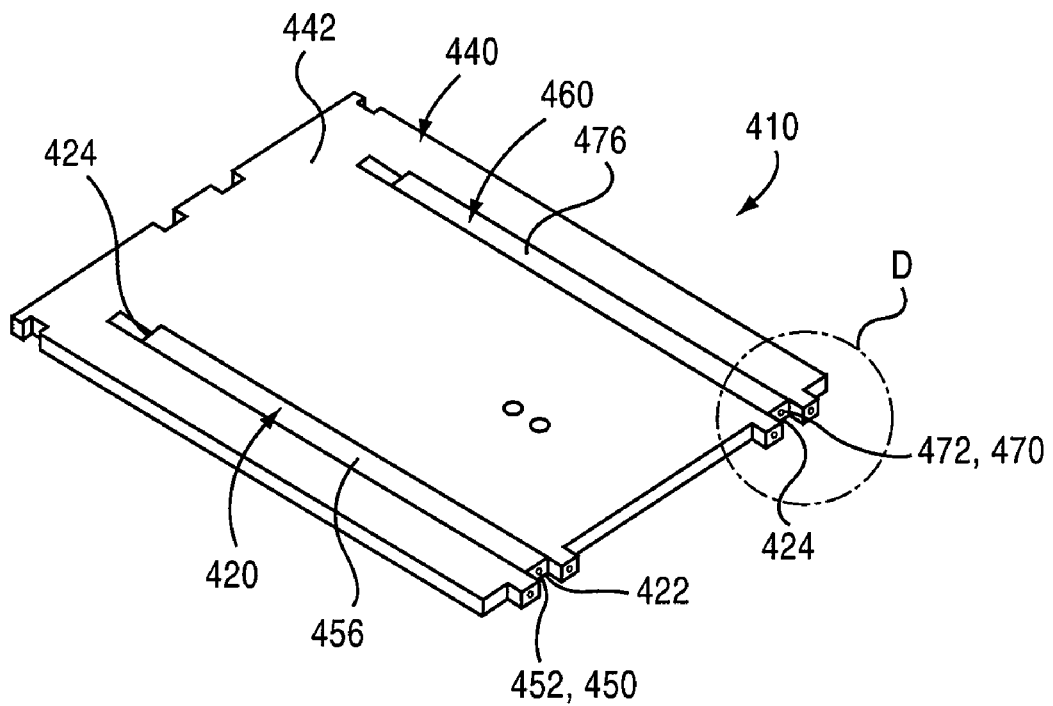
FIG. 7 is a perspective view of a first side of a cooling apparatus according to an embodiment of the invention.

FIGS. 4-6 illustrate another embodiment of a cooling apparatus. In this embodiment, an apparatus 310 includes a plate 340, a first body 320, a second body 360 and a tubular member 330. The first body 320 and the second body 360 can be, for example, formed and configured similar to the body 120 described above. The first body 320 includes a first end 322, a second end 324 and defines a passageway 350 (shown in FIG. 6) between the first end 322 and the second end 324. The first end 322 defines an opening 352 in communication with the passageway 350, and the second end 324 defines an opening 354 in communication with the passageway 350. The second body 360 includes a first end 362, a second end 364 and defines a passageway 370 between the first end 362 and the second end 364. The first end 362 defines an opening 372 and the second end 364 defines an opening (not shown) each opening being in communication with the passageway of the second body 360.

In this embodiment, a cross-section of each of body 320 and 360, as shown in FIG. 5, is substantially rectangular, and a cross-section of the passageways 350 and 370 is substantially circular. The body 320 and the body 360 each include a substantially planar surface 356 and 376, respectively. An inlet pipe for a source of fluid can be coupled to and in communication with one of the openings 352 or 372 and an outlet pipe can be coupled to and in communication with the other of openings 352 and 372. For example, the body 320 and the body 360 can each include a threaded portion within their passageway at the ends 322 and 362, respectively, for coupling to the inlet and/or outlet pipe.

As shown in FIGS. 5 and 6, the body 320 and the body 360 are each coupled to an outer surface 342 of the plate 340 such that at the body 320 and the body 360 extend above the surface 342 of the plate 340.

The apparatus 310 also includes the tubular member 330 that is coupled to both the body 320 and the body 360. The tubular member 330 defines a passageway 380 (shown in FIG. 6), an opening 382 on a first end 384 and another opening (not shown) on an opposite second end 386. The openings of the tubular member 330 are in communication with the passageway 380 of the tubular member 330. As shown in FIGS. 4 and 6, the first end of the tubular member 330 is coupled to the body 320 and the second end of the tubular member 330 is coupled to the body 360.

As best shown in FIG. 6, a portion of the tubular member 330 is coupled to a surface 344 of the plate 340, which is on an opposite side of the plate 340 than the side that the body 320 and the body 360 are disposed. In this embodiment, the ends of the tubular member 330 extend outward from the surface 342 of the plate 340 to couple to the body 320 and the body 360. For example, as shown in FIG. 6, the end 384 of tubular member 330 is coupled to the end 324 of the body 320. As stated above, the tubular member 330 can couple to the body 320 and the body 360 in a variety of different manners. For example, an epoxy, a threaded coupling or a quick connect fitting with an o-ring as will be described in more detail below with reference to the embodiment of FIG. 12.

In use, the apparatus 310 can be coupled to an electronic device such that at least a portion of the surface 356 and/or surface 376 of the bodies 320 and 360, respectively, are in contact with a desired portion of the electronic device. Fluid can flow through the passageway 350 of the body 320, through the passageway 380 of the tubular member 330 and through the passageway 370 of the body 360. Alternatively, the fluid can flow in an opposite direction depending on which of body 320 or body 360 is coupled to an inlet pipe for a source of fluid.

FIGS. 7-10 illustrate a cooling apparatus according to another embodiment. The cooling apparatus 410 is similar to the cooling apparatus 310 except that the body members are coupled to a plate such that an outer surface of the body members is substantially flush with an outer surface of the plate.

The apparatus 410 includes a plate 440, a first body 420, a second body 460 and a tubular member 430. The first body 420 defines a passageway (not shown) between a first end 422 and the second end 424. The second body 460 defines a passageway 470 between a first end 462 and a second end 464. The tubular member 430 defines a passageway (not shown) between a first end (not shown) and a second end 486 (FIG. 10) that is in fluid communication with the passageway 450 and the passageway 480.

Figure 8:
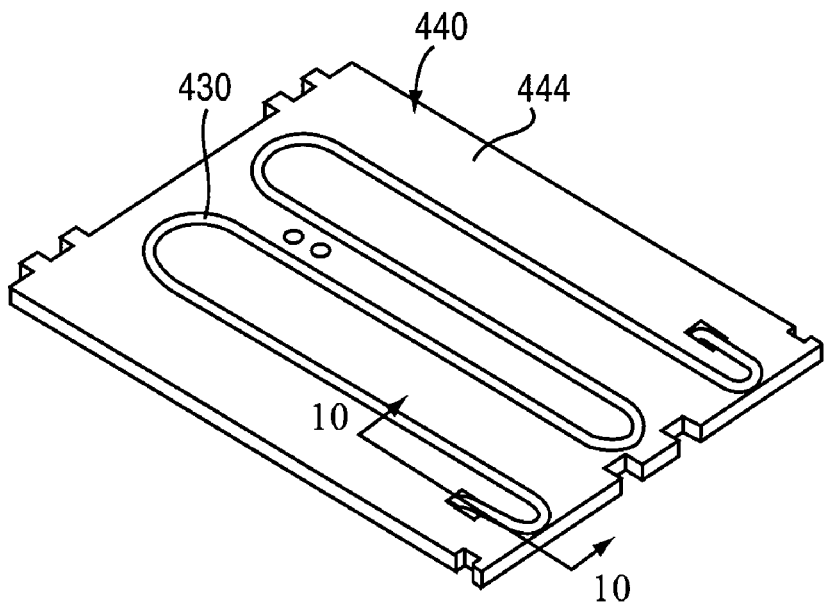
FIG. 8 is a perspective view of a second side opposite the first side illustrated in FIG. 7, of the cooling apparatus of FIG. 7.
Figure 9:
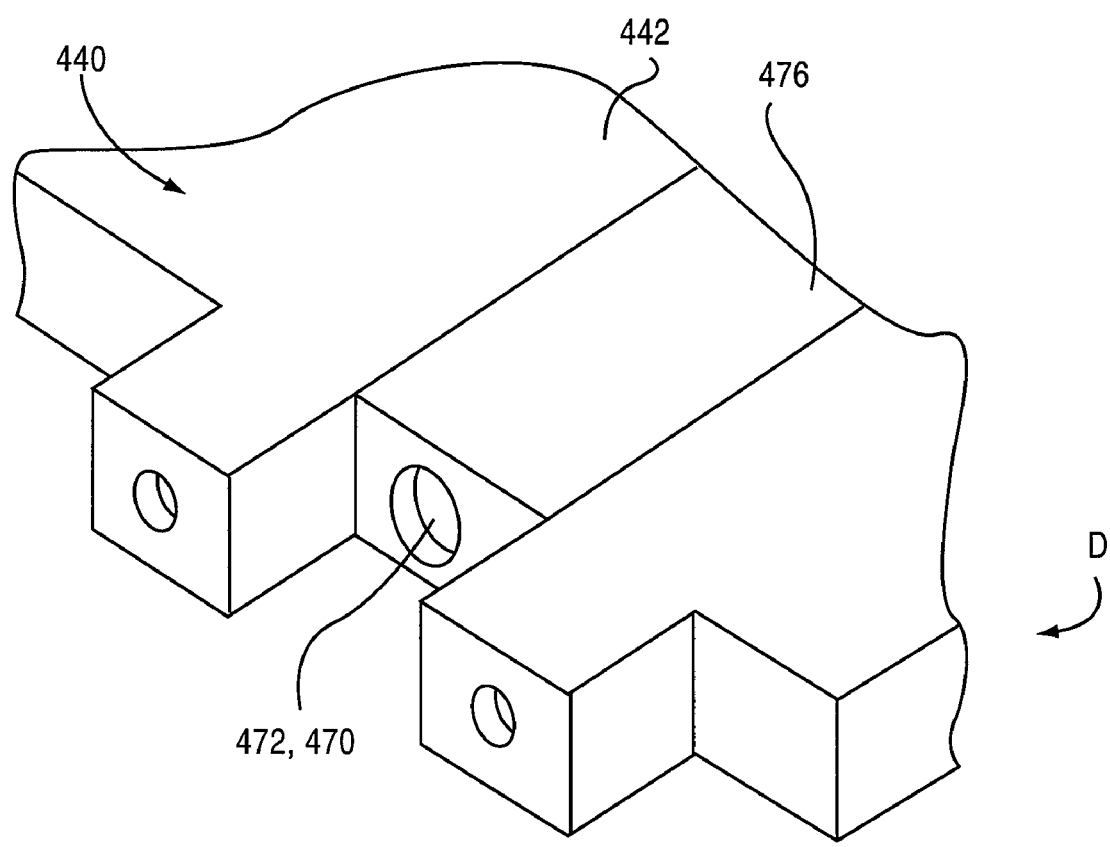
FIG. 9 is an enlarged perspective view of the portion of the cooling apparatus of FIGS. 7 and 8 labeled at D on FIG. 7.
Figure 10:
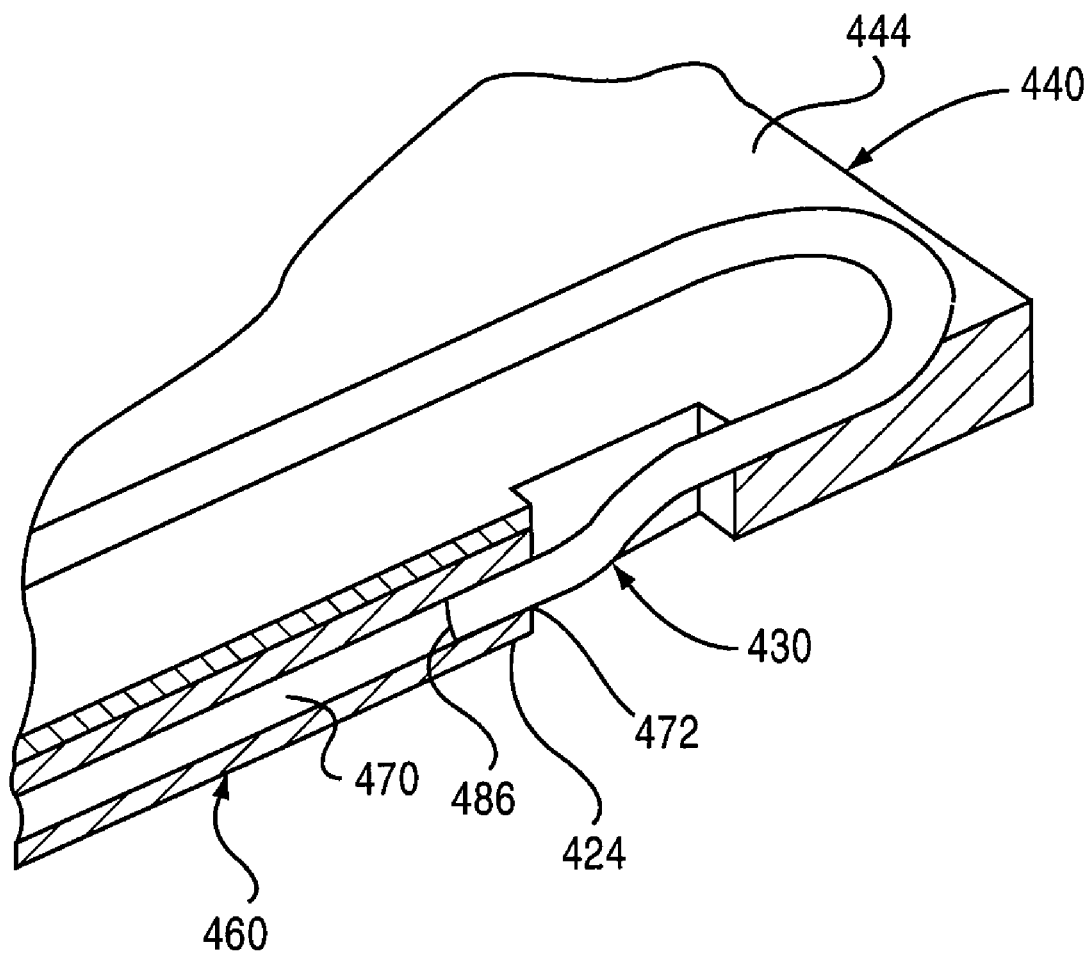
FIG. 10 is a partial cross-sectional view of a portion of the cooling apparatus of FIGS. 7 and 8 taken along line 10-10 in FIG. 8.

As stated above, in this embodiment, the body 420 and the body 460 are each coupled to the plate 440 such that a surface 456 and 476, respectively, are each substantially flush with the surface 442 of the plate 440, as best shown in FIG. 9. The tubular member 430 is coupled to a surface 444 of the plate 440 on an opposite side of the plate 440, as shown in FIG. 8, with each end of the tubular member 430 configured to mate with and couple to an end of body 420 and body 460, respectively. FIG. 10 illustrates an end 486 of the tubular member 430 coupled to an end 424 of the body 460. An inlet pipe for a source of fluid (not shown) can be coupled to and in communication with one of the openings 452 or 472 and an outlet pipe (not shown) can be coupled to and in communication with the other of openings 452 and 472.

As with the previous embodiment, the apparatus 410 can be coupled to an electronic device such that at least a portion of a surface of body 420 and/or body 460 (e.g., surface 456 and/or surface 476) is in contact with at least a portion of the electronic device. Fluid can flow through the passageway 450 of the body 420, through the passageway of the tubular member 430 and through the passageway 470 of the body 460.

Figure 11:
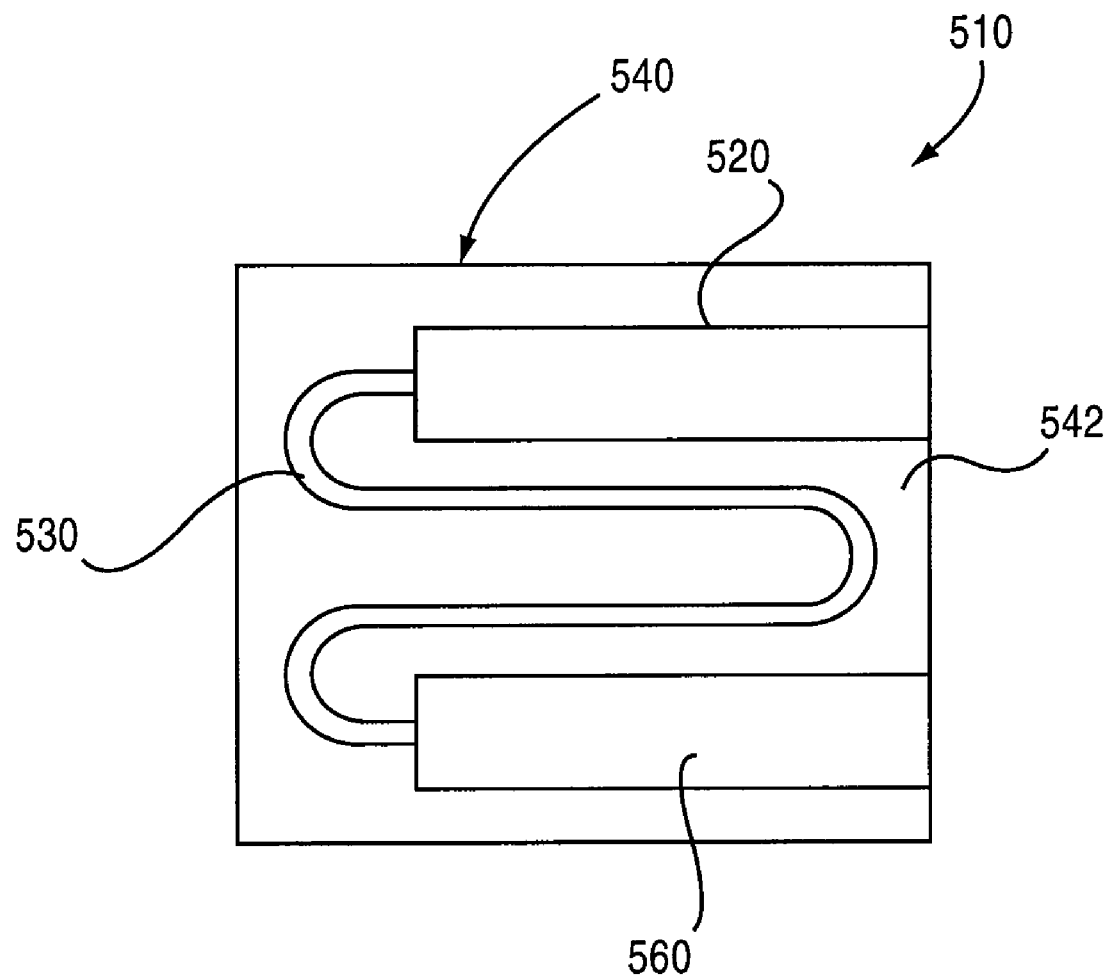
FIG. 11 is a top view of a cooling apparatus according to yet another embodiment of the invention.

FIG. 11 illustrates another embodiment of a cooling apparatus. A cooling apparatus 510 includes a plate 540, a tubular member 530, a first body 520 and a second body 560. Cooling apparatus 510 is similar to the previous embodiments, except in this embodiment, the first body 520, the second body 560 and the tubular member 530 are each coupled to the plate 540 on the same side of the plate 540. As previously stated, the tubular member 530, the first body 520, and/or the second body 560 can be at least partially countersunk from a surface 542 of the plate 540 and/or extend at least partially from the surface 542. In some embodiments, the tubular member 530, the first body 520, and/or the second body 560 can be coupled to the plate 540 such that a surface of the component is flush with the surface 542.

Figure 12:
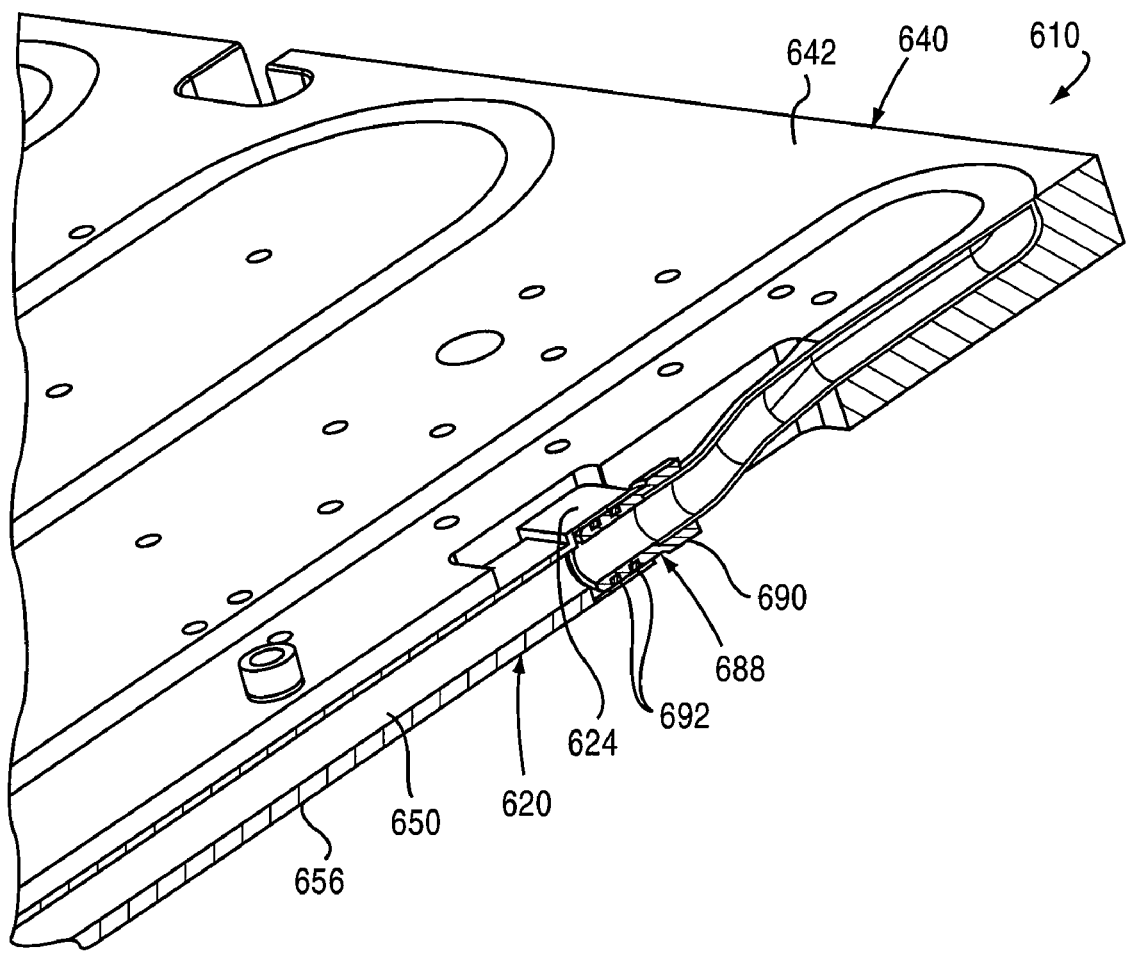
FIG. 12 is a perspective view, shown partially in cross-section of a portion of a cooling apparatus according to another embodiment of the invention.

FIG. 12 illustrates a portion of a cooling apparatus according to another embodiment shown partially in cross-section. This embodiment illustrates an o-ring fitting between the body members and the tubular member. An apparatus 610 includes a plate 640, a first body 620 and a tubular member 630. The apparatus 610 also includes a second body (not shown in FIG. 12). The cooling apparatus 610 is similar to the cooling apparatus 410 as the first body 620 and the second body are coupled to the plate 640 such that an outer surface of the first body 620 and an outer surface of the second body are substantially flush with an outer surface 642 of the plate 640.

As shown in FIG. 12, the first body 620 is coupled to the tubular member 630 with a fitting 688. The fitting 688 includes a connector 690, such as a water fitting connector, and a pair of o-rings 692. For example, the connector 690 can be a brass fitting coupled to an end of the tubular member 630. Although two o-rings are illustrated in this embodiment, a different number of o-rings can alternatively be used. An end 624 of the first body 620 is configured to mate with the fitting 688. The o-rings 692 provide a sealing fit between the tubular member 630 and the first body 620 and the second body.

As with the previous embodiment, the apparatus 610 can be coupled to an electronic device such that at least a portion of a surface 656 of the first body 620 and/or a surface of the second body is in contact with at least a portion of the electronic device. Fluid can flow through a passageway 650 of the first body 620, through a passageway 680 of the tubular member 630, and through a passageway of the second body.

Figure 13:
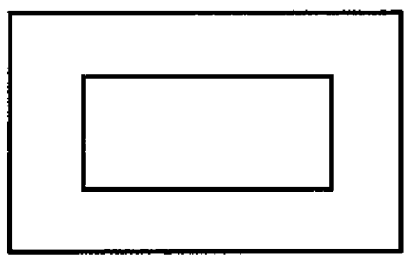
FIGS. 13-18 are each cross-sectional views of a body according to alternative embodiments of the invention.
Figure 14:
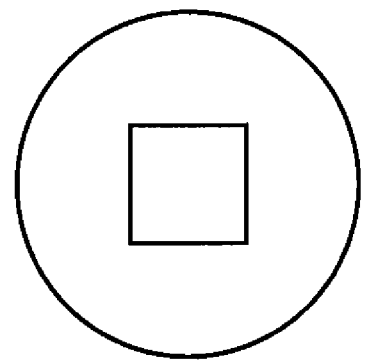
Figure 15:
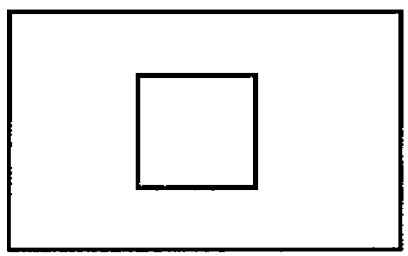
Figure 16:
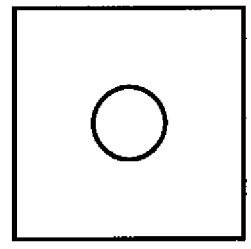
Figure 17:
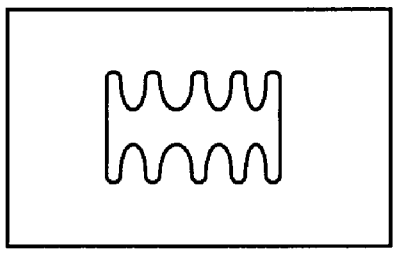
Figure 18:
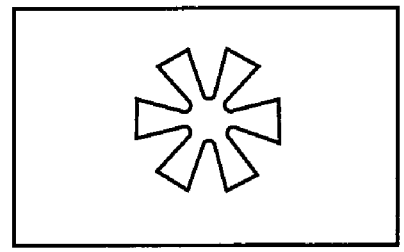

FIGS. 13-16 illustrate cross-sectional views of a body according to alternative embodiments of the invention. FIG. 13 illustrates a body having an outer perimeter with a rectangular cross-section and a passageway with a rectangular cross-section. FIG. 14 illustrates a body having an outer perimeter with a circular cross-section and a passageway having a square cross-section. FIG. 15 illustrates a body having an outer perimeter with a rectangular cross-section and a passageway having a square cross-section, and FIG. 16 illustrates a body having an outer perimeter with a square cross-section and a passageway having a circular cross-section. As stated previously, a body can have any combination of cross-section and passageway cross-section. A body can also have a first portion have one cross-section and a second portion having a different cross-section. For example, a body can have a passageway with a circular cross-section in one portion and another portion of the body can include protrusions within the passageway to alter the pressure of the flow of fluid through the passageway. FIGS. 17 and 18 each illustrate a body having a rectangular outer cross-section and a finned inner cross-section.

In conclusion, the present invention provides, among other things, a cooling system having a variety of different configurations depending on the particular intended use. For example, a cooling apparatus can include any combination or sub-combination of the components described herein. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. An apparatus, comprising:
   a plate comprising a substantially planar surface;
   an elongate body coupled to the plate, the elongate body including a substantially planar surface, a first end, a second end and defining a passageway configured to receive a fluid there through, the elongate body being coupled to the plate within a circumference of the substantially planar surface of the plate such that the substantially planar surface of the elongate body is generally flush with the substantially planar surface of the plate, and wherein, the planar surfaces of the elongate body and the plate are configured to be placed in contact with an electronic component; and
   a tubular member coupled to the plate, an end of the tubular member coupled to the first end of the elongate body such that a passageway of the tubular member is in communication with the passageway of the elongate body.

2. The apparatus of claim 1, wherein the elongate body and plate substantially planar surfaces are configured to couple to the electronic component.

3. The apparatus of claim 1, wherein the elongate body planar surface is an upper surface of the elongate body.

4. The apparatus of claim 1, wherein the second end of the elongate body is configured to be coupled to a source of fluid.

5. The apparatus of claim 1, wherein the tubular member is directly coupled to a first side of the plate and the elongate body is directly coupled to an opposing side of the plate.

6. The apparatus of claim 1, wherein the elongate body is a first elongate body, the apparatus further comprising:
   a second elongate body coupled to the plate within a circumference of the substantially planar surface of the plate, the second elongate body including a first end and a second end and defining a passageway configured to receive a fluid,
   the end of the tubular member being a first end, the tubular member including a second end coupled to the first end of the second elongate body such that the passageway of the tubular member is in communication with the passageway of the second elongate body.

7. The apparatus of claim 1, wherein an axis defined by the elongate body is substantially parallel to an axis defined by the tubular member.

8. The apparatus of claim 1, wherein the tubular member is threadedly coupled to the elongate body.

9. The apparatus of claim 1, wherein the plate has a first thermal resistance, the elongate body has a second thermal resistance different from the first thermal resistance.

10. The apparatus of claim 1, wherein the tubular member is sealingly coupled to the elongate body.

11. The apparatus of claim 1, wherein at least a portion of the passageway of the elongate body is substantially circular.

12. The apparatus of claim 1, wherein at least a portion of the passageway of the elongate body is substantially non-circular.

13. An apparatus, comprising:
   a first body and a second body each including a first end and a second end and defining a passageway configured to receive a fluid there through, the first end of the first body configured to be coupled to an inlet pipe, the first end of the second body configured to be coupled to an outlet pipe; and
   a tubular member defining a passageway, a first end of the tubular member coupled to the second end of the first body, a second end of the tubular member coupled to the second end of the second body such that the passageway of the tubular member is in communication with the passageway of the first body and the passageway of the second body; and
   a plate having a planar surface, wherein,
      the first and second bodies are at least partially disposed along the planar surface and are embedded within the plate so that each of the first and second bodies is coupled to the plate within a circumference of the planar surface of the plate and each of the first and second bodies have a surface that is co-planer with the planer surface of the plate, allowing thermal energy to distribute between the first and second bodies and the plate.

14. The apparatus of claim 13, wherein, at least one of the first and second bodies comprises an elongate body partially extending below the plate planar surface.

15. The apparatus of claim 13, wherein, at least one of the first and second bodies comprises an elongate body coupled onto the planar surface and extending outwardly from the outer planar surface.

16. An apparatus, comprising:
a first body and a second body each including a first end and a second end and defining a passageway configured to receive a fluid there through, the first end of the first body configured to be coupled to an inlet pipe, the first end of the second body configured to be coupled to an outlet pipe; and
a tubular member defining a passageway, a first end of the tubular member coupled to the second end of the first body, a second end of the tubular member coupled to the second end of the second body such that the passageway of the tubular member is in communication with the passageway of the first body and the passageway of the second body; and
a plate having a planar surface, wherein,
the first and second bodies are at least partially disposed along the planar surface and are embedded within the plate so that each of the first and second bodies is coupled to the plate within a circumference of the planar surface of the plate and each of the first and second bodies have a surface that is co-planer with the planer surface of the plate, allowing thermal energy to distribute between the first and second bodies and the plate;
wherein, the tubular member is flush with the plate planar surface.

17. The apparatus of claim 16, wherein
the first body and the second body are formed at least partially with copper.

18. The apparatus of claim 16, wherein at least one of the first body or the second body includes a surface configured to be placed in contact with an electronic component.

19. The apparatus of claim 16, wherein at least one of the first body or the second body has a substantially non-circular outer perimeter and the tubular member has a substantially circular cross-section.

20. The apparatus of claim 16, wherein the first end of the tubular member is threadedly coupled to the second end of the first body, the second end of the tubular member is threadedly coupled to the second end of the second body.

21. The apparatus of claim 16, wherein a longitudinal axis defined by one of the first body passageway or the second body passageway is substantially parallel to a longitudinal axis defined by at least a portion of the tubular member passageway.

22. The apparatus of claim 16, wherein an axis defined by the first body is substantially parallel to an axis defined by the second body.

23. The apparatus of claim 16, wherein at least one of the first body or the second body has a substantially non-circular outer perimeter and the passageway of at least one of the first body or the second body has a substantially circular cross-section.

24. The apparatus of claim 16, wherein:
the first body being coupled to the plate, the plate has a first thermal resistance and the first body has a second thermal resistance different from the first thermal resistance.

* * * * *